(12) United States Patent
Smorenburg et al.

(10) Patent No.: US 10,996,568 B2
(45) Date of Patent: May 4, 2021

(54) METHODS AND APPARATUS FOR METROLOGY

(71) Applicant: ASML Netherlands B.V., Veldhoven (NL)

(72) Inventors: Petrus Wilhelmus Smorenburg, Veldhoven (NL); Seyed Iman Mossavat, Waalre (NL); Teis Johan Coenen, Vught (NL)

(73) Assignee: ASML Netherlands B.V, Veldhoven (NL)

( * ) Notice: Subject to any disclaimer, the term of this patent is extended or adjusted under 35 U.S.C. 154(b) by 0 days.

(21) Appl. No.: 16/720,411

(22) Filed: Dec. 19, 2019

(65) Prior Publication Data

US 2020/0201192 A1 Jun. 25, 2020

(30) Foreign Application Priority Data

Dec. 21, 2018 (EP) .................................... 18215345
Feb. 19, 2019 (EP) .................................... 19158015

(51) Int. Cl.
*G03F 7/20* (2006.01)
*G01N 23/201* (2018.01)

(52) U.S. Cl.
CPC ........ *G03F 7/70625* (2013.01); *G03F 7/7065* (2013.01); *G03F 7/70633* (2013.01); *G01N 23/201* (2013.01)

(58) Field of Classification Search
CPC ............ G03F 7/70625; G03F 7/70633; G03F 7/7065; G03F 7/70033; G03F 7/70616;
(Continued)

(56) References Cited

U.S. PATENT DOCUMENTS 6,952,253 B2    10/2005  Lof et al.
10,146,140 B2*  12/2018  Pisarenco ............... G03F 7/705
(Continued)

FOREIGN PATENT DOCUMENTS

EP          3 441 820 A    2/2019
WO    WO 2019/014283 A1   1/2019

OTHER PUBLICATIONS

Lemaillet et al., "Intercomparison between optical and x-ray scatterometry measurements of FinFET structures," Proc. of SPIE Metrology, Inspection, and Process Control for Microlithography XXVII, vol. 8681, Apr. 10, 2013; 8 pages.

(Continued)

*Primary Examiner* — Deoram Persaud
(74) *Attorney, Agent, or Firm* — Sterne, Kessler, Goldstein & Fox P.L.L.C.

(57) ABSTRACT

Methods and apparatus for directing onto a substrate a radiation beam emitted as a result of high harmonic generation (HHG). Exemplary apparatus comprising: a drive radiation source; an interaction region configured to receive a medium and positioned such that a drive radiation beam from the drive radiation source interacts with the medium during use to generate the emitted radiation beam by HHG, wherein the emitted radiation beam comprises a plurality of wavelengths and wherein an emission divergence angle of the emitted radiation is wavelength dependent; an optical system downstream of the interaction region and configured to focus the emitted radiation beam, wherein the plurality of wavelengths of the emitted radiation beam are focused at a plurality of focal planes in dependence on the associated emission divergence angle; and a substrate support for holding the substrate at one of a plurality of axial positions relative to the plurality of focal planes, wherein one or more of the drive radiation source, the interaction region, the optical system and the substrate support is configurable to (Continued)

control a relative position of at least one of the focal planes with respect to the substrate.

16 Claims, 4 Drawing Sheets

(58) Field of Classification Search
CPC ........ G01N 23/201; G01B 11/02; G01B 9/04; H05G 2/00
See application file for complete search history.

(56) References Cited

U.S. PATENT DOCUMENTS

| | | | |
|---|---|---|---|
| 10,401,739 B2* | 9/2019 | Geypen | G03F 7/70508 |
| 2007/0224518 A1 | 9/2007 | Yokhin et al. | |
| 2013/0304424 A1 | 11/2013 | Bakeman et al. | |
| 2014/0019097 A1 | 1/2014 | Bakeman et al. | |
| 2016/0282282 A1 | 9/2016 | Quintanilha et al. | |
| 2017/0184981 A1 | 6/2017 | Quintanilha et al. | |
| 2017/0357155 A1* | 12/2017 | Quintanilha | G03F 7/2004 |
| 2018/0136568 A1* | 5/2018 | Roobol | G02F 1/353 |
| 2018/0224753 A1* | 8/2018 | Mathijssen | G03F 7/70625 |
| 2018/0348145 A1 | 12/2018 | Witte et al. | |
| 2019/0017946 A1 | 1/2019 | Wack et al. | |
| 2019/0049861 A1* | 2/2019 | Van Voorst | G03F 7/70616 |
| 2019/0107786 A1* | 4/2019 | Van Boxmeer | G03F 7/70158 |
| 2019/0155125 A1* | 5/2019 | Chen | G02F 1/353 |
| 2019/0204757 A1* | 7/2019 | Brussaard | G03F 7/70033 |
| 2019/0286787 A1* | 9/2019 | Chouaib | G01R 31/311 |
| 2020/0097633 A1* | 3/2020 | Mahajan | G03F 7/70625 |
| 2020/0098486 A1* | 3/2020 | Coenen | G03F 7/70516 |

OTHER PUBLICATIONS

International Search Report and Written Opinion of the International Searching Authority directed to related International Patent Application No. PCT/EP2019/081565, dated Mar. 3, 2020; 16 pages.

Huang et al., "New scheme to control x-ray deformable mirrors," Proceedings of SPIE, vol. 9687, Oct. 25, 2016; 12 pages.

* cited by examiner

METHODS AND APPARATUS FOR METROLOGY

FIELD

The invention relates to methods and apparatus for use in metrology, in particular for use in metrology of lithographic patterning processes. In specific arrangements, the invention relates to methods and apparatus for use in metrology using soft x-ray (SXR) or extreme ultraviolet (EUV) radiation, as defined herein.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

As an alternative to optical metrology methods, it has also been considered to use soft X-rays (SXR) or EUV radiation, for example radiation in a wavelength range between 0.1 nm and 100 nm, or optionally between 1 nm and 50 nm or optionally between 10 nm and 20 nm. Applications of SXR include, but are not limited to, current or near-future measurement tools for the semiconductor industry. One example of metrology tool functioning in one of the above presented wavelength ranges is transmissive small angle X-ray scattering (T-SAXS as in US 2007224518A which content is incorporated herein by reference in its entirety). Profile (CD) measurements using T-SAXS are discussed by Lemaillet et al in "Intercomparison between optical and X-ray scatterometry measurements of FinFET structures", Proc. of SPIE, 2013, 8681. Reflectometry techniques using X-rays (GI-XRS) and extreme ultraviolet (EUV) radiation at grazing incidence are known for measuring properties of films and stacks of layers on a substrate. Within the general field of reflectometry, goniometric and/or spectroscopic techniques can be applied. In goniometry, the variation of a reflected beam with different incidence angles is measured. Spectroscopic reflectometry, on the other hand, measures the spectrum of wavelengths reflected at a given angle (using broadband radiation). For example, EUV reflectometry has been used for inspection of mask blanks, prior to manufacture of reticles (patterning devices) for use in EUV lithography.

It is possible that the range of application makes the use of wavelengths in the soft X-rays or EUV domain not sufficient. Therefore published patent applications US 20130304424A1 and US2014019097A1 (Bakeman et al/KLA) describe hybrid metrology techniques in which measurements made using x-rays and optical measurements with wavelengths in the range 120 nm and 2000 nm are combined together to obtain a measurement of a parameter such as CD. A CD measurement is obtained by coupling and x-ray mathematical model and an optical mathematical model through one or more common. The content of the cited US patent application are incorporated herein by reference in their entirety.

As mentioned above, current optical metrology tools for wafer inspection use light in the visible range. Visible range wavelengths are often much larger than the pitch values that appear on-device. As a result the metrology solutions either have dedicated targets with large pitch to generate diffraction orders or they measure at resolution but rely on $0^{th}$ order information provided by evanescent waves.

Measurements on target with large pitch are not necessarily representative of in-device pitches, and evanescent waves do not penetrate deep into a stack forming a feature on the substrate, limiting the application space. In contrast, SXR potentially provides both sufficient spatial resolution to resolve the small pitch of semiconductor devices and can penetrate more deeply into the stack.

It is possible to generate an SXR beam using high-harmonic generation (HHG), in which an intense laser pulse of visible or infrared (IR) radiation (drive radiation) is shot into a gaseous medium, leading to emission of SXR (emitted radiation) by the gas atoms due to their interaction with the laser light. The HHG-generated SXR radiation may then be focused onto a target on the substrate by means of an optical system that transfers the radiation from the medium to the target. The radiation may then be reflected and/or diffracted from the target and detected and processed to infer properties of the target. Examples of such parameters relevant for semiconductor manufacturing are critical dimension (CD), overlay, material refractive index, etc.

In general, optical metrology tools for the semiconductor industry rely heavily on comparing measurements of light diffracted by a feature on the substrate, such as a target, to predicted diffraction patterns generated by a computational model. Parameters of the feature or target such as feature dimensions are inferred by identifying which values of the parameters yield the best match between measured and predicted diffraction patterns.

The use of SXR and EUV radiation in metrology presents a number of challenges.

SUMMARY

The inventors have appreciated that the use of SXR radiation generated by HHG-results in different wavelengths of the Ska radiation being focused at different axial positions, or focal planes, after propagation through an optical system. Exemplary methods and apparatus disclosed herein relate to use of those focal planes in metrology of lithographic processes.

According to an aspect of the invention, there is provided an apparatus for directing onto a substrate a radiation beam emitted as a result of high harmonic generation (HHG), the apparatus comprising: a drive radiation source; an interaction region configured to receive a medium and positioned such that a drive radiation beam from the drive radiation source interacts with the medium during use to generate the emitted radiation beam by HEW, wherein the emitted radiation beam comprises a plurality of wavelengths and wherein an emission divergence angle of the emitted radiation is wavelength dependent; an optical system downstream of the interaction region and configured to focus the emitted radiation beam, wherein the plurality of wavelengths of the emitted radiation beam are focused at a plurality of focal planes in dependence on the associated emission divergence angle; and a substrate support for holding the substrate at one of a plurality of axial positions relative to the plurality of focal planes, wherein one or more of the drive radiation source, the interaction region, the optical system and the substrate support is configurable to control a relative position of at least one of the focal planes with respect to the substrate.

Configuring the medium, which may be a gaseous medium, and/or the drive radiation source can affect the emission divergence angle of one or more wavelengths of the emitted radiation, which in turn can affect the axial position of a focal plane of those wavelengths. Configuring the optical system and/or the substrate support, which may be a wafer table, may affect the axial position of all focal planes. As used herein, the term "axial position" encompasses a position along the optical axis of an apparatus, although a change in axial position may be seen parallel to the optical axis and need not mean that the feature is on the optical axis.

Optionally, the interaction region comprises a nozzle for directing the medium toward the interaction region or a gas cell for retaining the medium, and wherein the nozzle or gas cell is configured for control of an axial position of the medium.

Optionally, the drive radiation source is configured for control of an axial position of a focal point of the drive radiation beam.

Optionally, the optical system is configured to control an axial position of one or more of the focal planes.

Optionally, the substrate support is configured to control an axial position of the substrate held thereon.

Optionally, when the emitted radiation beam is diffracted and/or reflected from a feature on the substrate, an intensity of diffracted and/or reflected radiation is dependent on wavelength of the emitted radiation beam, and the one or more of the drive radiation source, the interaction region, the optical system and the substrate support is configurable to control the relative position of at least one of the focal planes with respect to the substrate based on the intensity of the diffracted and/or reflected radiation. The intensity of the diffracted and/or reflected radiation may be estimated and/or measured.

Optionally, the diffracted and/or reflected radiation comprises positive and negative orders and a difference in intensity between the positive and negative orders is dependent on wavelength of the emitted radiation beam, and the one or more of the drive radiation source, the interaction region, the optical system and the substrate support is configurable to control the relative position of at least one of the focal planes with respect to the substrate based on the difference in intensity between positive and negative orders. The difference in intensity of the diffracted and/or reflected radiation may be estimated and/or measured.

Optionally, a first difference in intensity is based on the feature having no error in one or more parameters, and wherein a second difference in intensity is based on the feature having a particular error in the one or more parameters, and the one or more of the drive radiation source, the interaction region, the optical system and the substrate support is configurable to control the relative position of at least one of the focal planes with respect to the substrate based on a difference between the first difference in intensity and the second difference in intensity. The difference in intensity of the diffracted and/or reflected radiation may be estimated and/or measured.

Optionally, the one or more of the drive radiation source, the interaction region, the optical system and the substrate support is configurable to position a selected focal plane to be substantially coincident with a plane of the substrate, wherein the selected focal plane is determined based on the intensity of diffracted and/or reflected radiation.

Optionally, the one or more of the drive radiation source, the interaction region, the optical system and the substrate support is configurable to position a plurality of selected focal planes to be substantially coincident with the substrate.

Optionally, the apparatus further comprises a first radiation detector configured to detect the positive order of diffracted and/or reflected radiation and a second radiation detector configured to detect the negative order of diffracted and/or reflected radiation.

Optionally, the one or more of the drive radiation source, the interaction region, the optical system and the substrate support is configured such that a first wavelength of the emitted radiation beam forms a first spot-size at the substrate and a second wavelength of the emitted radiation beam forms a second spot-size at the substrate that is larger than the first spot-size, the apparatus comprising at least one radiation detector configured to receive first diffracted and/or reflected radiation diffracted and/or reflected from a feature of the substrate at the first wavelength and second diffracted and/or reflected radiation diffracted and/or reflected from a feature of the substrate at the second wavelength; and a processor configured to execute computer program code to undertake the method of: comparing an intensity of the first diffracted and/or reflected radiation to an intensity of the second diffracted and/or reflected radiation; and determining a model for intensity of diffracted and/or reflected radiation as a function of spot-size.

Optionally, the feature of the substrate comprises a plurality of lines fabricated on the substrate, and wherein the model is indicative of an effect of the lines on the diffracted and/or reflected radiation. A finite number of lines on a target, for example, can affect the intensity of the diffracted and/or reflected radiation and the model can be used to mitigate for or remove such "finite line effects".

Optionally, the processor is further configured to: predict an intensity of one or more pixels of an image of radiation diffracted and/or reflected from the feature based on the determined model; compare the predicted intensity with a measured intensity of one or more corresponding pixels of an image of radiation diffracted and/or reflected from the feature; and determine one or more parameters of a patterning process based on the comparison.

Optionally, the one or more of the drive radiation source, the interaction region, the optical system and the substrate support is configured such that at least one wavelength of the emitted radiation beam forms a first spot-size at the substrate and subsequently forms a second spot-size at the substrate that is different to the first spot-size, the apparatus comprising at least one radiation detector configured to receive first diffracted and/or reflected radiation diffracted and/or reflected from a feature of the substrate at the at least one wavelength having the first spot-size and second diffracted and/or reflected radiation diffracted and/or reflected from the feature of the substrate at the at least one wavelength having the second spot-size; and a processor configured to execute computer program code to undertake the method of: determining an intensity of the emitted radiation at the first spot-size and an intensity of the emitted radiation at the second spot-size; determining an intensity of the first diffracted and/or reflected radiation and an intensity of the second diffracted and/or reflected radiation; and based on the determined intensities, determining a model for intensity of diffracted and/or reflected radiation as a function of spot-size.

Optionally, the determined model is indicative of non-linear effects on intensity of diffracted and/or reflected radiation with spot-size. Non-linear effects may be induced by the high intensity of an emitted radiation beam, e.g. an SXR beam. For example, the emitted radiation beam may affect a sensitive resist on top of the feature of the substrate, which may induce changes in intensity of the diffracted and/or reflected radiation. Intensity of the emitted radiation beam that is incident on the feature is a function of spot-size.

Optionally, the one or more of the drive radiation source, the interaction region, the optical system and the substrate support is configured such that at least one wavelength of the emitted radiation beam is focused on the substrate to form a spot-size at a diameter greater than a threshold value. Keeping the spot-size above a threshold value may keep the intensity of the emitted radiation beam that is incident on the feature of the substrate below a corresponding threshold value.

Optionally, the one or more of the drive radiation source, the interaction region, the optical system and the substrate support is configured such that a first wavelength of the emitted radiation beam forms a first spot-size at a first depth of the substrate and a second wavelength of the emitted radiation forms a second spot-size at a second depth of the substrate.

Optionally, the first wavelength is selected based on a sensitivity of the first wavelength to aspects of a feature of the substrate at the first depth and/or the second wavelength is selected based on a sensitivity of the second wavelength to aspects of a feature of the substrate at the second depth.

Optionally, a feature of the substrate comprises a target, and wherein the one or more of the drive radiation source, the interaction region, the optical system and the substrate support is configured such that a first wavelength of the emitted radiation forms a spot-size underfilling the target and a second wavelength of the emitted radiation forms a spot-size overfilling the target.

Optionally, the first and/or second wavelengths are selected based on their sensitivity to aspects of the target and/or aspects of further features of the substrate outside an area of the target.

Optionally, the emitted radiation has a wavelength in a range from 0.1 nm to 100 nm.

According to the invention in an aspect, there is provided a metrology apparatus comprising an apparatus according to any described herein and particularly as set out above.

According to the invention in an aspect, there is provided a method of directing radiation towards a feature of a substrate, the method comprising: directing a drive radiation beam from a drive radiation source towards an interaction region, the interaction region including a medium configured to interact with the drive radiation to generate the emitted radiation by wherein the emitted radiation beam comprises a plurality of wavelengths and wherein an emission divergence angle of the emitted radiation is wavelength dependent; propagating the emitted radiation through an optical system downstream of the interaction region; focusing the emitted radiation beam onto a substrate held by a substrate support, wherein the plurality of wavelengths of the emitted radiation beam are focused at a plurality of focal planes in dependence on the associated emission divergence angle; and controlling one or more of the drive radiation source, the interaction region, the optical system and the substrate support is configurable to control a relative position of at least one of the focal planes with respect to the substrate.

Optionally, the method further comprises: configuring the one or more of the drive radiation source, the interaction region, the optical system and the substrate support such that a first wavelength of the emitted radiation beam forms a first spot-size at the substrate and a second wavelength of the emitted radiation beam forms a second spot-size at the substrate that is larger than the first spot-size; receiving, by at least one radiation detector, first diffracted and/or reflected radiation diffracted and/or reflected from a feature of the substrate at the first wavelength and second diffracted and/or reflected radiation diffracted and/or reflected from a feature of the substrate at the second wavelength; comparing an intensity of the first diffracted and/or reflected radiation to an intensity of the second diffracted and/or reflected radiation; and determining a model for intensity of diffracted and/or reflected radiation as a function of spot-size.

Optionally, the method further comprises: configuring the one or more of the drive radiation source, the interaction region, the optical system and the substrate support such that at least one wavelength of the emitted radiation beam forms a first spot-size at the substrate and subsequently forms a second spot-size at the substrate that is different to the first spot-size, receiving, by at least one radiation detector, first diffracted and/or reflected radiation diffracted and/or reflected from a feature of the substrate at the at least one wavelength having the first spot-size and second diffracted and/or reflected radiation diffracted and/or reflected from the feature of the substrate at the at least one wavelength having the second spot-size; determining an intensity of the emitted radiation at the first spot-size and an intensity of the emitted radiation at the second spot-size; determining an intensity of the first diffracted and/or reflected radiation and an intensity of the second diffracted and/or reflected radiation; and based on the determined intensities, determining a model for intensity of diffracted and/or reflected radiation as a function of spot-size.

Optionally, the method further comprises configuring the one or more of the drive radiation source, the interaction region, the optical system and the substrate support is configured such that at least one wavelength of the emitted radiation beam is focused at the substrate to form a spot-size at a diameter greater than a threshold value.

Optionally, the method further comprises configuring the one or more of the drive radiation source, the interaction region, the optical system and the substrate support is configured such that a first wavelength of the emitted radiation beam forms a first spot-size at a first depth of the substrate and a second wavelength of the emitted radiation forms a second spot-size at a second depth of the substrate.

According to the invention in an aspect, there is provided a computer program comprising instructions which, when executed on at least one processor, cause the at least one processor to control an apparatus to carry out the method according to any described herein and particular as defined above.

According to the invention in an aspect, there is provided a carrier containing the computer mentioned above and elsewhere herein, wherein the carrier is one of an electronic signal, optical signal, radio signal, or non-transitory computer readable storage medium.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm), EUV (extreme ultra-violet radiation, e.g. having a wavelength in the range of about 5-100 nm) and SXR radiation having a wavelength in a range from 0.1-100 nm.

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
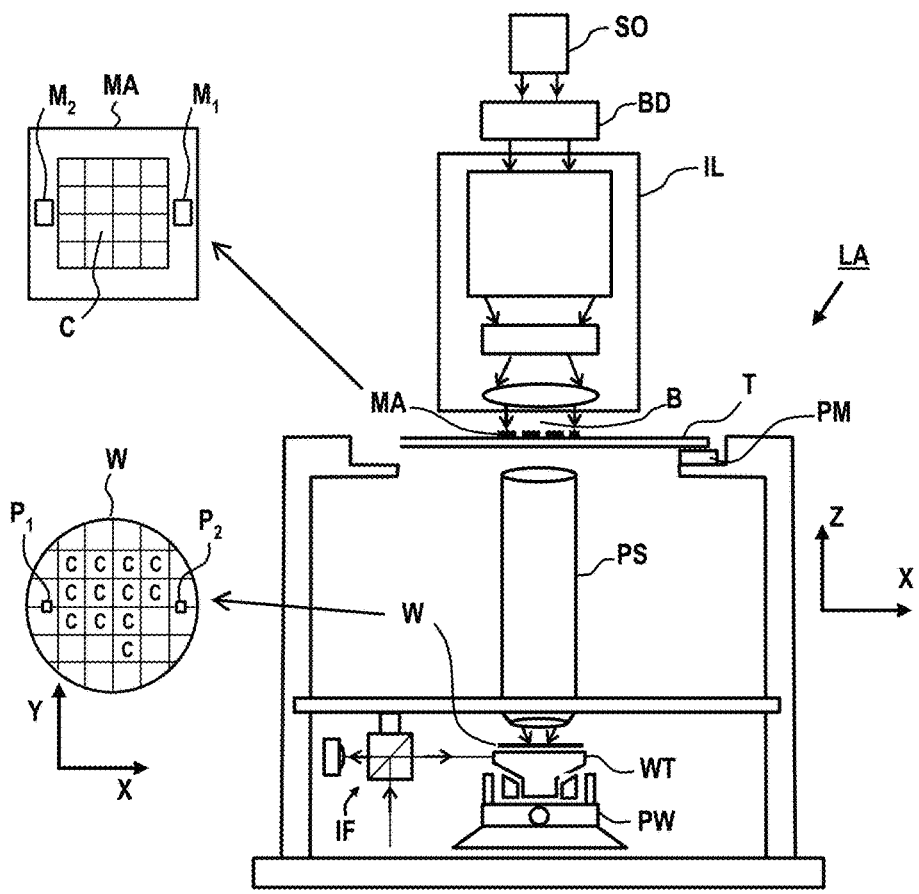
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MS constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS. The projection system may also be termed an optical system.

The lithographic apparatus LA may be of a type wherein at least a portion of the substrate may be covered by a liquid having a relatively high refractive index, e.g., water, so as to fill a space between the projection system PS and the substrate W which is also referred to as immersion lithography. More information on immersion techniques is given in U.S. Pat. No. 6,952,253, which is incorporated herein by reference.

The lithographic apparatus LA may also be of a type having two or more substrate supports (or substrate tables) WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor (or optical/radiation detector) and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MS, and is patterned by the pattern (design layout)

present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
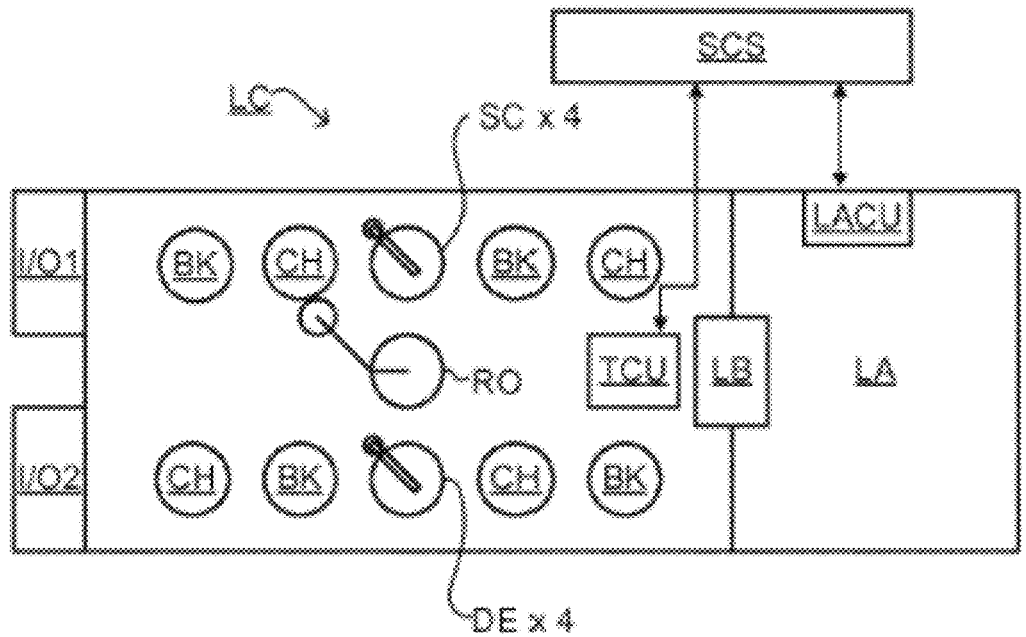
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DIE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
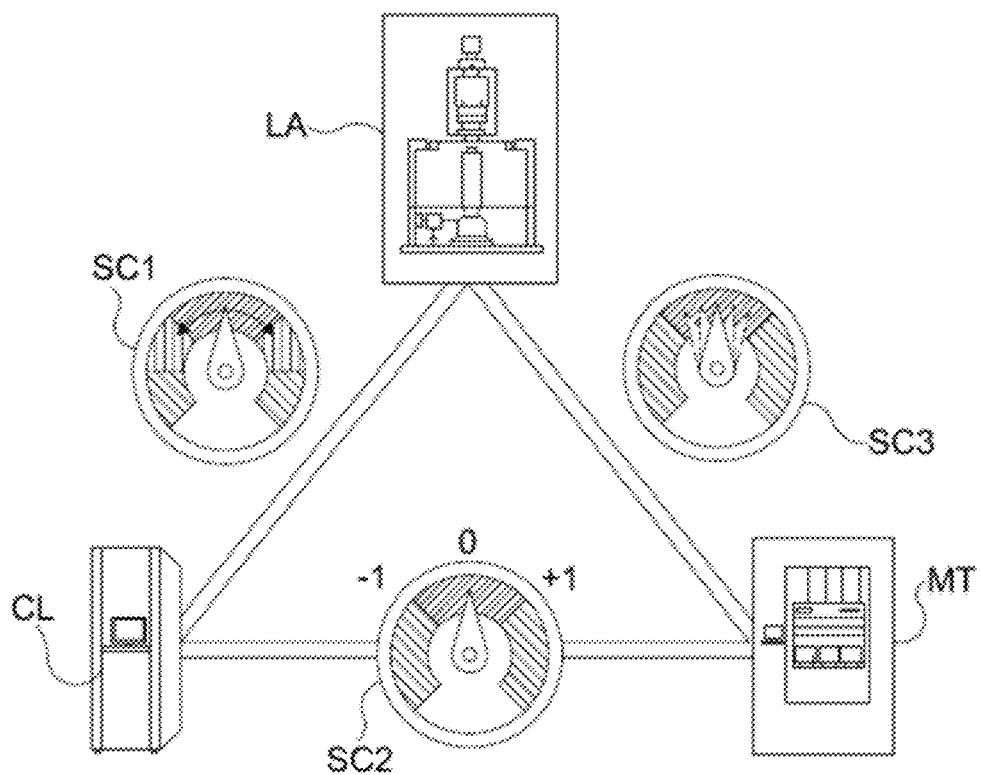
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—within which the process parameters in the lithographic process or patterning process may be allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Optionally, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

Figure 4:
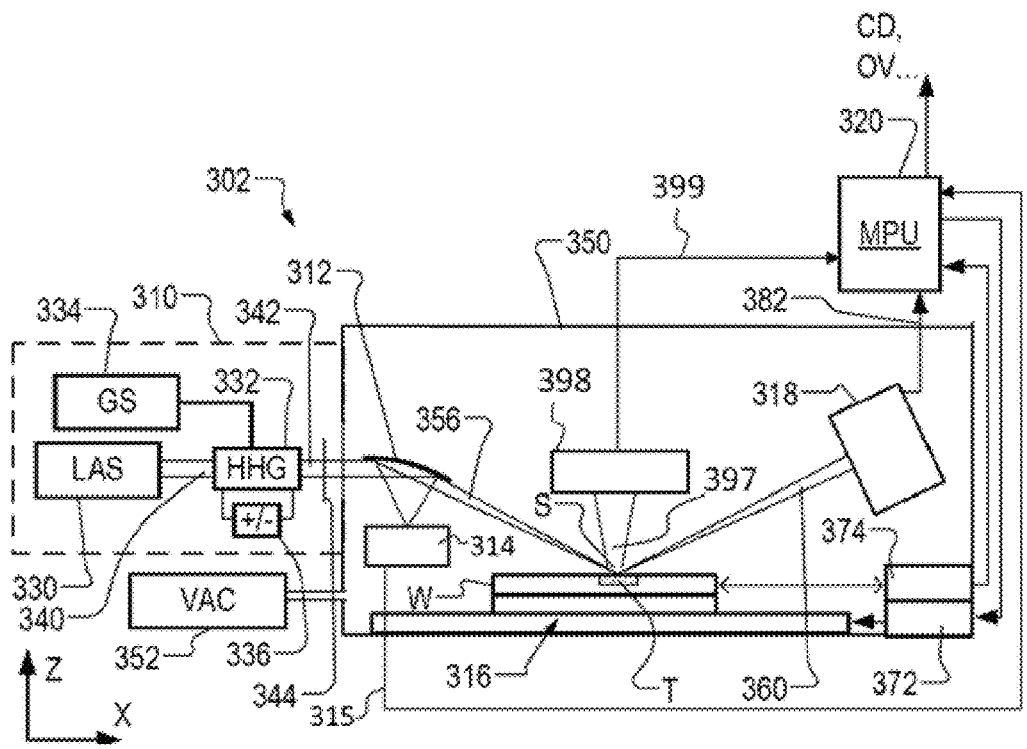
FIG. 4 shows a schematic representation of an SXR metrology apparatus.

FIG. 4 depicts a schematic representation of a metrology apparatus 302 in which radiation in the wavelength range from 0.1 nm to 100 nm may be used to measure parameters of structures on a substrate. The metrology apparatus 302 presented in FIG. 4 is suitable for the soft X-rays or EUV domain.

FIG. 4 illustrates a schematic physical arrangement of a metrology apparatus 302 comprising a spectroscopic scatterometer using EUV and/or SXR radiation in grazing incidence, purely by way of example. An alternative form of inspection apparatus might be provided in the form of an angle-resolved scatterometer, which uses radiation in normal or near-normal incidence similar to the conventional scatterometers operating at longer wavelengths.

Inspection apparatus 302 comprises a radiation source 310, illumination system (or optical system) 312, substrate support 316, detection systems, which may comprise radiation detectors, 318, 398 and metrology processing unit (MPU) 320.

Source 310 in this example comprises a generator of EUV or soft x-ray radiation based on high harmonic generation (REIG) techniques. Such sources are available for example from KMLabs, Boulder Colo., USA (http://www.kmlabs.com/). Main components of the radiation source are a drive radiation source, such as a laser 330 and an interaction region comprising a medium, in this case in the form of an HHG gas cell 332. A gas supply 334 supplies suitable gas to the gas cell, where it is optionally ionized by an electric source 336. The drive laser 300 may be, for example, a fiber-based laser with an optical amplifier, producing pulses of infrared radiation that may last for example less than 1 ns (1 nanosecond) per pulse, with a pulse repetition rate up to several megahertz, as required. The wavelength of the infrared radiation may be for example in the region of 1 μm (1 micron). The laser pulses are delivered as a first radiation beam 340 to the HHG gas cell 332, where in the gas a portion of the radiation is converted to higher frequencies than the first radiation into an emitted radiation beam 342 including coherent second radiation of the desired wavelength or wavelengths.

The second radiation may contain multiple wavelengths. If the radiation were monochromatic, then measurement calculations (for example reconstruction) may be simplified, but it is easier with HHG to produce radiation with several wavelengths. In addition, irradiating a substrate with a broad range of wavelengths of radiation allows a greater amount of information to be obtained from reflected/diffracted radiation. The volume of gas within the gas cell 332 defines an HHG space, although the space need not be completely enclosed and a flow of gas may be used instead of a static volume. The gas may be for example a noble gas such as neon (Ne) or argon (Ar). N2, O2, He, Ar, Kr, Xe gases can all be considered. These are matters of design choice, and may even be selectable options within the same apparatus. Different wavelengths will, for example, provide different levels of contrast when imaging structure of different materials. For inspection of metal structures or silicon structures, for example, different wavelengths may be selected to those used for imaging features of (carbon-based) resist, or for detecting contamination of such different materials. One or more filtering devices 344 may be provided. For example a filter such as a thin membrane of aluminum (Al) or zirconium may serve to cut the fundamental IR radiation from passing further into the inspection apparatus. A grating (not shown) may be provided to select one or more specific harmonic wavelengths from among those generated in the gas cell. Some or all of the beam path may be contained within a vacuum environment, bearing in mind that SXR radiation is absorbed when traveling in air. The various components of radiation source 310 and illumination optics 312 can be adjustable to implement different metrology 'recipes' within the same apparatus. For example different wavelengths and/or polarization can be made selectable.

Depending on the materials of the structure under inspection, different wavelengths may offer a desired level of penetration into lower layers. For resolving the smallest device features and defects among the smallest device features, a short wavelength is likely to be preferred. For example, one or more wavelengths in the range 1-20 nm or optionally in the range 140 nm or optionally in the range 10-20 nm may be chosen. Wavelengths shorter than 5 nm suffer from very low critical angle when reflecting off materials typically of interest in semiconductor manufacture. Therefore to choose a wavelength greater than 5 nm will provide stronger signals at higher angles of incidence. On the other hand, if the inspection task is for detecting the presence of a certain material, for example to detect contamination, then wavelengths up to 50 nm could be useful.

From the radiation source 310, the filtered beam 342 enters an inspection chamber 350 where the substrate W including a structure (or feature of the substrate) of interest is held for inspection at a measurement position by substrate support 316. The feature of the substrate is labeled T and may comprise a target and/or device or product structures. The atmosphere within inspection chamber 350 is maintained near vacuum by vacuum pump 352, so that EUV radiation can pass with-out undue attenuation through the atmosphere. The Illumination system 312 has the function of focusing the radiation into a focused beam 356, and may comprise for example a two-dimensionally curved mirror, or a series of one-dimensionally curved mirrors, as described in published US patent application US2017/0184981A1 (which content is incorporated herein by reference in its entirety), mentioned above. The focusing is performed to achieve a round or elliptical spot 5, which in some exemplary arrangements may be under 10 μm in diameter, when projected onto the feature of the substrate. Substrate support 316 comprises for example an X-Y translation stage and a rotation stage, by which any part of the substrate W can be brought to the focal point of beam to in a desired orientation. Thus the radiation spot S is formed on the feature of the substrate. Alternatively, or additionally, substrate support 316 comprises for example a tilting stage that may tilt the substrate W at a certain angle to control the angle of incidence of the focused beam on the feature of the substrate T.

Optionally, the illumination system 312 provides a reference beam of radiation to a reference detector 314 which may be configured to measure a spectrum and/or intensities of different wavelengths in the filtered beam 342. The reference detector 314 may be configured to generate a signal 315 that is provided to processor 310 and the filter may comprise information about the spectrum of the filtered beam 342 and/or the intensities of the different wavelengths in the filtered beam.

Reflected and/or diffracted radiation 360 is captured by radiation detector 318 and a spectrum is provided to processor 320 for use in calculating a property of the feature of the substrate T. The illumination system 312 and detection system 318 thus form an inspection apparatus. This inspection apparatus may comprise a soft X-ray and/or EUV spectroscopic reflectometer of the kind described in US2016282282A1 which content is incorporated herein by reference in its entirety.

If the feature of the substrate T has a certain periodicity, the radiation of the focused beam 356 may be partially diffracted as well. The diffracted radiation 397 follows another path at well-defined angles with respect to the angle of incidence than the reflected radiation 360. In FIG. 4, the drawn diffracted radiation 397 is drawn in a schematic manner and diffracted radiation 397 may follow many other paths than the drawn paths. The inspection apparatus 302 may also comprise further detection systems 398 that detect and/or image at least a portion of the diffracted radiation 397. In FIG. 4 a single further detection system 398 is drawn, but embodiments of the inspection apparatus 302 may also comprise more than one further detection system 398 that are arranged at different position to detect and/or image diffracted radiation 397 at a plurality of diffraction directions. In other words, the (higher) diffraction orders of the focused radiation beam that impinges on the feature of the substrate T are detected and/or imaged by one or more further detection systems 398. The one or more detection systems 398 generates a signal 399 that is provided to the metrology processor 320. The signal 399 may include information of the diffracted light 397 and/or may include images obtained from the diffracted light 397.

To aid the alignment and focusing of the spot S with desired product structures, inspection apparatus 302 may also provide auxiliary optics using auxiliary radiation under control of metrology processor 320. Metrology processor 320 can also communicate with a position controller 372 which operates the translation stage, rotation and/or tilting stages. Processor 320 receives highly accurate feedback on the position and orientation of the substrate, via sensors. Sensors 374 may include interferometers, for example, which can give accuracy in the region of picometers. In the operation of the inspection apparatus 302, spectrum data 382 captured by detection system 318 is delivered to metrology processing unit 320.

As mentioned an alternative form of inspection apparatus uses soft X-ray and/or EUV radiation at normal incidence or near-normal incidence, for example to perform diffraction-based measurements of asymmetry. Both types of inspection apparatus could be provided in a hybrid metrology system. Performance parameters to be measured can include overlay (OVL), critical dimension (CD), coherent diffraction imaging (CDI) and at-resolution overlay (ARO) metrology. The soft X-ray and/or EUV radiation may for example have wavelengths less than 100 nm, for example using radiation in the range 5-30 nm, of optionally in the range from 10 nm to 20 nm. The radiation may be narrowband or broadband in character. The radiation may have discrete peaks in a specific wavelength band or may have a more continuous character.

Like the optical scatterometer used in today's production facilities, the inspection apparatus 302 can be used to measure structures within the resist material treated within the litho cell (After Develop Inspection or ADI), and/or to measure structures after they have been formed in harder material (After Etch Inspection or AEI). For example, substrates may be inspected using the inspection apparatus 302 after they have been processed by a developing apparatus, etching apparatus, annealing apparatus and/or other apparatus.

The apparatus shown in FIG. 4 comprises a drive radiation source 330, an interaction region at an HHG gas cell 332, an optical system 312 and a substrate support 316. The interaction region receives a medium (e.g. a gas) and is positioned such that a drive radiation beam 340 emitted from the drive radiation source 330 interacts with the medium to generate emitted radiation 342 by HHG. The emitted radiation 342 comprises a plurality of wavelengths of radiation, which may be in the SXR range. Each of the plurality of wavelengths is emitted from the medium at an emission divergence angle that is dependent on wavelength. As used herein, the term emission divergence angle encompasses a divergence angle of the emitted radiation. The emission divergence angle may be due to curvature of a wavefront of the emitted radiation at a downstream end of the medium, e.g. gas medium.

Figure 5:
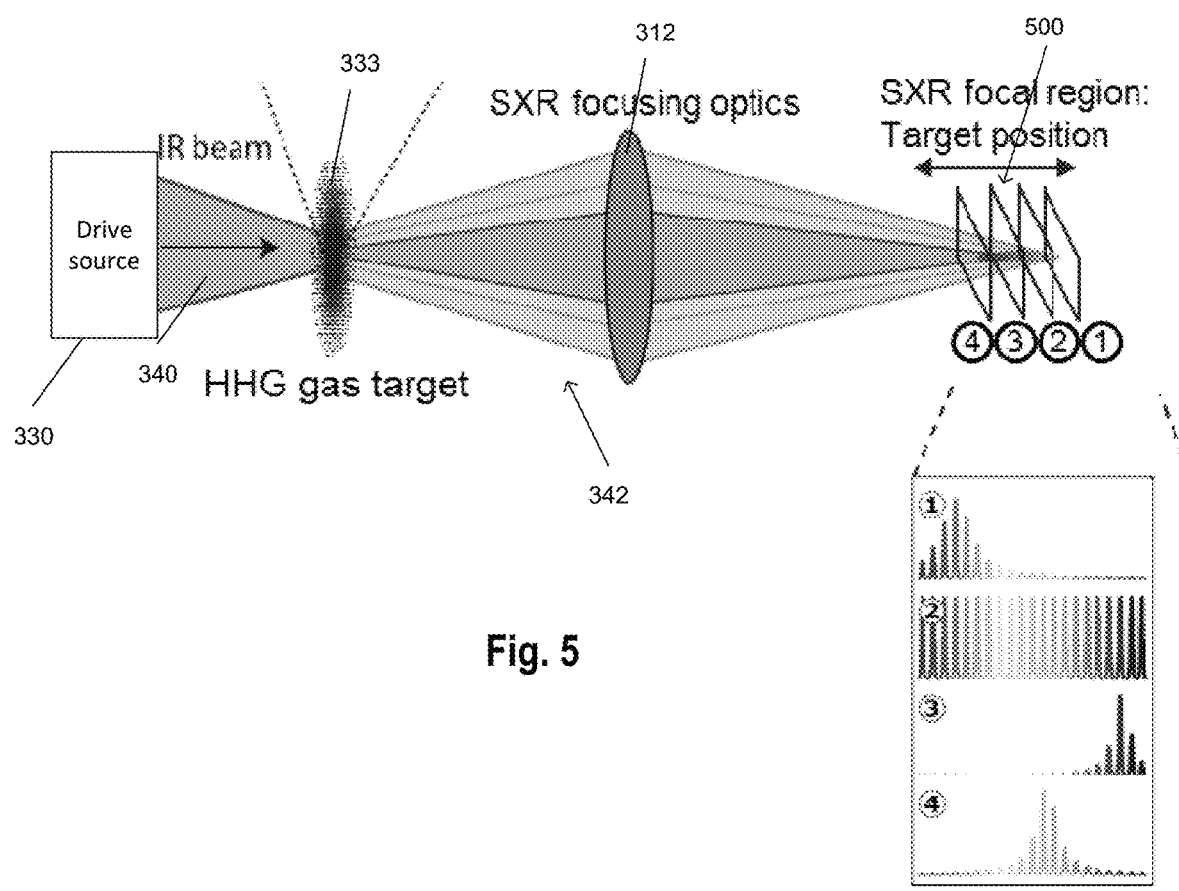
FIG. 5 shows a simplified schematic representation of an SXR metrology apparatus.

FIG. 5 shows a simplified view of apparatus of FIG. 4. As can be seen, a drive radiation source 330 emits a drive radiation beam 340. The drive radiation beam 340 interacts with a medium 333, which may be positioned at the HHG cell 332. The resulting emitted radiation beam 342 comprises a plurality of wavelengths, each shown in FIG. 5 by a different shaded area. The plurality of wavelengths of radiation in the emitted radiation beam 342 have emission divergence angles that are dependent on wavelength, as shown in FIG. 5. The emitted radiation beam 342 propagates through the optical system 312, which is configured to focus the emitted radiation beam towards the substrate W (not shown in FIG. 5). The optical system 312 may comprise a plurality of optical elements such as lenses and mirrors, but is shown as a lens in FIG. 5 for simplicity. As a result of the different emission divergence angles, the optical system 312 focusses the emitted radiation beam 342 at a plurality of focal planes 500. This is shown in the plots 1-4 shown on the right hand side of FIG. 5, which show intensity against wavelength at each of the focal planes 1-4. As can be seen, placement of the feature T of the substrate W with respect to the focal planes 500 controls the intensity of light at each wavelength that is incident on the feature T. In addition, placement of the feature T of the substrate W with respect to the focal planes 500 controls a diameter (or other cross sectional dimension) of the emitted radiation beam 342 at the substrate W. Where the emitted radiation beam 342 has a small diameter, its intensity on the optical axis is higher and where the diameter is large its axial intensity is lower.

The drive radiation source 330 may be configured for control of the emission divergence angle of the emitted radiation beam 342. For example, in some arrangements the drive radiation source 330 is configured for control of the focus point of the drive radiation beam 340 relative to the position of the medium 333. This in turn controls the emission divergence angle of one or more wavelengths of the emitted radiation beam 342. In specific cases, controlling the focus point of the drive radiation beam 340 may change the relative emission divergence angle between wavelengths of the emitted radiation beam 342, which in turn can control the relative axial positions of the focal planes 500. In other arrangements, the drive radiation source 330 may be configured to control one or more of the drive radiation beam 340 intensity; the waist size of the drive radiation beam 340; and a wavefront or transverse intensity profile of the drive radiation beam 340, for example by means of a spatial light modulator (SLM) or other customized optical elements. Any of these parameters may alter the emission divergence angle of the emitted radiation beam 342 and therefore the relative positions of the focal points of the emitted radiation beam 342. In other arrangements, the type and make-up of the medium may be controlled for control of the emission divergence angle. For a gas medium for example, the gas species and pressure of the gas may be controlled.

The position of the medium 333 relative to the focal point of the drive radiation beam 340 also controls the emission divergence angle of one or more wavelengths of the emitted radiation beam 342. In specific cases, controlling the position of the medium with respect to the focus point of the drive radiation beam 340 controls the relative emission divergence angle between wavelengths of the emitted radiation beam 342, which in turn can control the relative axial position of the focal planes 500. Accordingly, in some arrangements, the interaction region may comprise one or more nozzles configured to direct the medium towards a particular axial position. In other arrangements, the axial position of the gas cell 332 may be controlled.

In some arrangements, the optical system 312 may be configured to control the focusing of the wavelengths of the emitted radiation beam 342. In specific cases, the optical system 312 may control the axial position of the focal planes 500 while keeping their relative positions substantially the same.

In some arrangements, the substrate support 316 is configured to control the axial position of the substrate W, thereby controlling the axial position relative to each of the focal planes 500.

In view of the above, one or more of the drive radiation source 330, the medium 333 at the interaction region, the optical system 312 and the substrate support 316 may be configured to control a relative position of at least one of the focal planes with respect to the substrate.

The system described above may be used in a number of ways to estimate a parameter of the feature T, which in turn may be used to estimate a parameter of a lithographic process. Some exemplary uses are described below, although others will be apparent to the skilled person.

Optical metrology including SXR metrology provides rapid non-destructive measurements at the cost of limited information content of the measurement. The measurements, depending on the application, may not provide sufficient parameter sensitivity, leading to the problem known as correlation. To make clear what is meant by this, consider for example a first semiconductor target with two parameters, say, linewidth L1 and layer thickness T1, that happens to result in almost the same pattern in diffracted radiation as a second target that has linewidth L2 and layer thickness T2. In such a case one cannot easily discriminate between the first and second targets from measured diffraction patterns. In such cases there is considered to be a high correlation between the linewidth and the layer thickness, and the parameter sensitivity of the measurement is poor. To mitigate this problem and elicit more information, increasing the diversity of the measurement is a common strategy. By diversity it is meant different measurement modes that can provide complementary information about the target, for example measuring with different illumination angles, or wavelengths. Methods and apparatus disclosed herein provide additional measurement modes to increase the sensitivity of the measurement.

Figure 6:
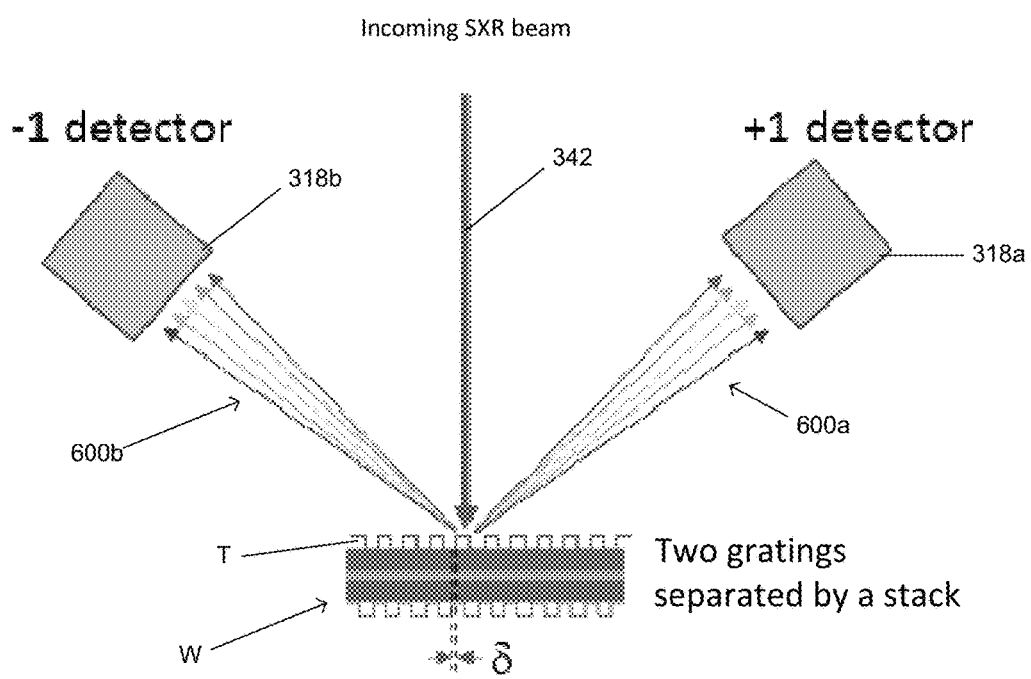
FIG. 6 shows a schematic representation of emitted radiation by HHG being diffracted from a feature of a substrate and received by radiation detectors.

As discussed above, in optical metrology tools, when a target or other feature on the substrate (e.g. that includes a grating) is illuminated by a radiation beam, the light will diffract and/or reflect off this target. When two gratings, separated by a stack of other layers have an offset with respect to each other, there can occur a difference between the light diffracted in the +1 order and −1 order. This difference can be measured (and calibrated) to determine the overlay error 6 between the two gratings. This is depicted in simplified fashion in FIG. 6, which shows the emitted radiation beam 342, which may comprise a plurality of wavelengths of radiation in the SXR range and may have been emitted by HHG, incident on a feature T of the substrate W. One or more radiation detectors are configured to receive radiation diffracted and/or reflected from the feature T. In the exemplary arrangement shown in FIG. 6, first and second radiation detectors 318a, 318b are configured to receive +1 order diffracted radiation 600a and −1 order diffracted radiation 600b, although higher orders may also be used. The +1 order and −1 order diffracted radiation 600a, 600b comprise a plurality of wavelengths, which are shown by separate arrows and are diffracted at different angles based on wavelength.

Figure 7:
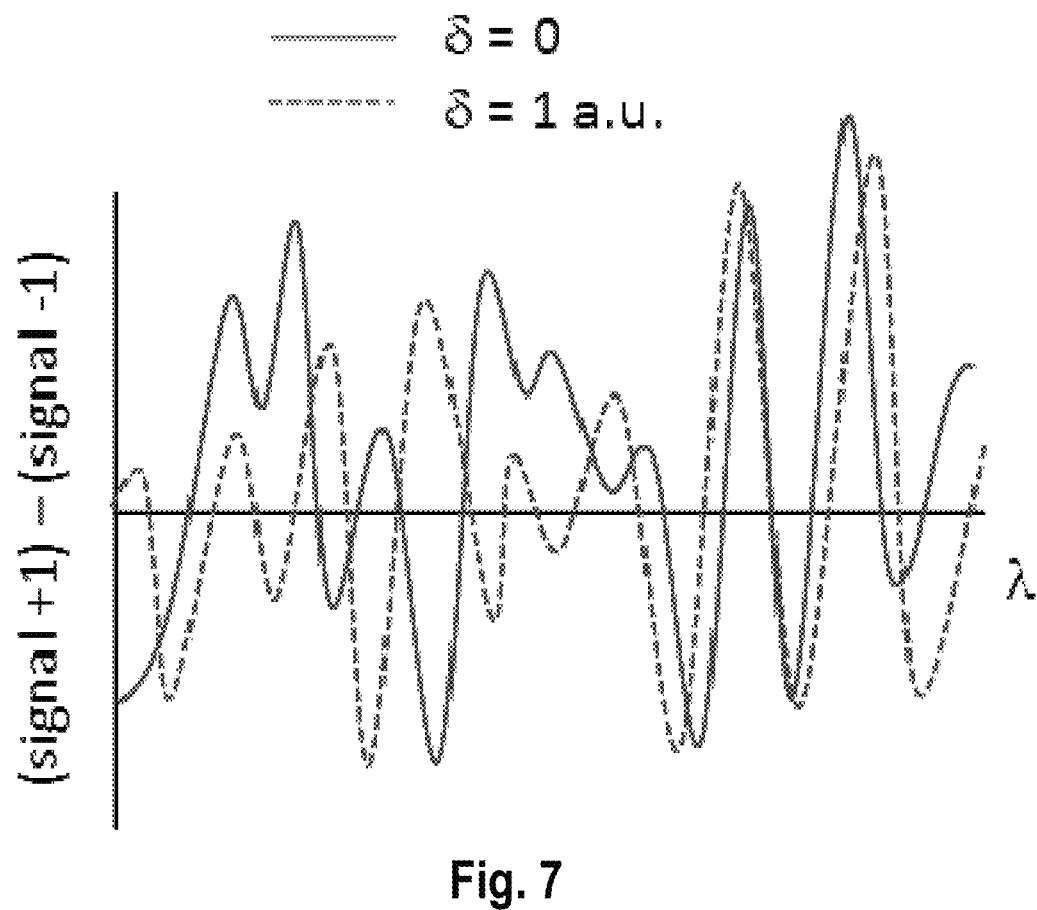
FIG. 7 shows exemplary swing curves.

Accordingly, the difference in the diffracted radiation 600a, 600b received by the radiation detectors 318a, 318b is dependent on the wavelength of the emitted radiation that is incident on the feature T, due to interference of the light in the layers of the stack between the gratings of the feature T. This dependence can be plotted in a so-called swing curve, which is shown in FIG. 7 for an overlay error of zero (solid line) and an overlay error of 1 a.u. (dashed line). The swing curve is also dependent on the composition of the intermediate layers in the stack. It is desirable to measure a parameter (e.g. overlay) of the feature T at a wavelength and/or intensity of emitted radiation that has a high sensitivity to error in that parameter. In the case of overlay in the example of FIG. 7, such sensitivity is shown at wavelengths having the largest difference between the solid and dashed lines of the swing curves. Alternatively, one could measure using emitted radiation across a spectrum of wavelengths in order to increase sensitivity.

An important condition is that the different wavelengths can be resolved enough to resolve the oscillations in the swing curve. When the emitted radiation beam 342 is diffracted from the feature T, each wavelength diffracted will have an emission divergence angle related to the numerical aperture of the emitted radiation beam 342. This emission divergence angle can result in overlapping of the wavelengths of diffracted radiation 600a, 600b shown in FIG. 6 and a specific pixel of a radiation detector 342 may receive diffracted radiation at a plurality of wavelengths. This can make resolving the swing curves more difficult. In exemplary arrangements, one or more of the drive radiation source 330, the medium 333 at the interaction region, the optical system 312 and the substrate support 316 may be configured to control the axial position of the substrate with respect to the focal planes 500 to select each of a plurality of wavelengths of the emitted radiation beam 342 to be focused on the feature T in turn such that the diffracted radiation 600a, 600b at those wavelengths may be resolved. This may be used to determine the swing curves.

In exemplary arrangements, one or more of the drive radiation source 330, the interaction region 333, the optical system 312 and the substrate support 316 may be configured to control the axial position of the substrate with respect to the focal planes 500 based on an intensity of diffracted radiation 600a, 600b. The intensity of the diffracted radiation may be predicted based on models and/or measurements taken using a different substrate.

In one exemplary arrangement, the radiation detectors 318a, 318b receive +1 and −1 order diffracted radiation 600a, 600b. A difference between the +1 and −1 order diffracted radiation 600a, 600b is wavelength dependent, as shown in the swing curves of FIG. 7. One or more of the drive radiation source 330, the interaction region 333, the optical system 312 and the substrate support 316 may be configured to focus one or more wavelengths at the substrate W based on the difference in intensity of the +1 and −1 orders of diffracted radiation. That is, a wavelength having a desired sensitivity to a parameter to be measured may be selected by axial positioning of the substrate support 316 with respect to the focal planes. The wavelengths may be selected based on predicted wavelengths from, for example previously generated swing curves.

In other arrangements, a first swing curve may be plotted based on a first difference between intensity of +1 and −1 orders of diffracted radiation for a feature T having no error in a given parameter. A further swing curve may be plotted based on a second difference between intensity of +1 and −1 orders of diffracted radiation for the feature having a known error in the given parameter. One or more of the drive radiation source 330, the interaction region 333, the optical system 312 and the substrate support 316 may be configured to focus one or more wavelengths at the substrate W based on the difference between the first difference in intensity and the second difference in intensity. This may be visualised as a difference between the first and second swing curves (e.g. the solid and dashed lines of FIG. 7). If the difference between the first difference in intensity and the second difference in intensity is greater than a threshold value then that may indicate a degree of sensitivity to errors in the parameter/. The axial position of the substrate W with respect to the focal planes 500 may be selected based on that sensitivity.

Optionally, the feature T, which may be a metrology target, comprises some periodic structure (referred to as "lines" in the following). Because there are usually a very large number of lines per target, some computational models can ease computations by assuming an infinite number lines, without introducing significant error. However, since the targets envisioned for SXR metrology are significantly smaller, it may be that they comprise a smaller number of lines and the relatively small number of lines may have an impact on the measured diffracted radiation. This impact may be termed "finite line effects" and may be determined by varying a spot-size of the emitted radiation 342 at the substrate W and thereby varying a number of illuminated lines in a controlled and wavelength-dependent way.

Accordingly, one or more of the drive radiation source 330, the interaction region 333, the optical system 312 and the substrate support 316 may be configured to focus a first wavelength of the emitted radiation 342 to a first spot-size at the feature T of the substrate W. The radiation detectors 318a, 318b receive diffracted radiation 600a, 600b as a result of the first wavelength of the emitted radiation 342 being incident on the feature T. One or more of the drive radiation source 330, the interaction region 333, the optical system 312 and the substrate support 316 may be configured to focus a second wavelength of the emitted radiation 342 to a second spot-size at the substrate. The radiation detectors 318a, 318b receive diffracted radiation 600a, 600b as a result of the second wavelength of the emitted radiation 342 being incident on the feature T.

Further, apparatus described herein may comprise a processor that is configured to compare the intensity of the diffracted radiation caused by diffraction of the first wavelength to the intensity of the diffracted radiation caused by diffraction of the second wavelength. The processor may then determine a model for intensity of diffracted radiation as a function of spot-size and/or wavelength. The model may be indicative of finite line effects.

In other arrangements, one or more of the drive radiation source 330, the interaction region 333, the optical system 312 and the substrate support 316 may be configured to focus a wavelength of the emitted radiation 342 to a first spot-size at the feature T of the substrate W. The radiation detectors 318a, 318b receive diffracted radiation 600a, 600b as a result of the wavelength of the emitted radiation 342 being incident on the feature T at the first spot-size. One or more of the drive radiation source 330, the interaction region 333, the optical system 312 and the substrate support 316 may be configured to focus and the same wavelength of the emitted radiation 342 to a second spot-size at the substrate. The radiation detectors 318a, 318b receive diffracted radiation 600a, 600b as a result of the wavelength of the emitted radiation 342 being incident on the feature T at the second spot-size.

Further, apparatus described herein may comprise a processor that is configured to compare the intensity of the diffracted radiation caused by the wavelength at the first spot-size to the intensity of the diffracted radiation caused by the wavelength at the second spot-size. The processor may then determine a model for intensity of diffracted radiation as a function of spot-size and/or wavelength.

By varying the spot size of a certain wavelength, also the intensity of that wavelength varies (as mentioned above). This enables the determination of nonlinear effects in intensity of diffracted radiation at particular wavelengths and that are suspected to be induced by high SXR intensity. In other arrangements, one or more of the drive radiation source 330, the interaction region 333, the optical system 312 and the substrate support 316 may be configured to keep the spot-size of a certain wavelength greater than a threshold value to prevent the intensity of the emitted radiation beam 342 becoming high enough to induce nonlinear and/or destructive effects, for example in case of sensitive resist on top of the feature. Therefore, the determined model may be indicative of non-linear effects on intensity of diffracted and/or reflected radiation with spot-size.

In some arrangements, the determined model(s) may be used to determine parameters of a lithographic patterning process in ways that will be understood by the skilled person. Specifically, a processor may be configured to predict an intensity of one or more pixels of an image of radiation diffracted from the feature T based on the determined model. The emitted radiation beam 342 may then be controlled to be incident on the feature T and the radiation detectors 318a, 318b may then receive diffracted radiation 600a, 600b to determine measured diffracted images. The processor may then compare the predicted intensity with a measured intensity of one or more corresponding pixels of the diffracted images of radiation diffracted from the feature. The processor may then determine one or more parameters of a lithographic patterning process based on the comparison.

Any (intended or unintended) local variations, i.e. variations within the feature T, may be determined by applying a range of different spot-sizes to the target. For example, corner effects are illuminated by a relatively large spot but not by a relatively small spot. With chromatic focusing (the use of the plurality of focal planes 500), this can be determined in a wavelength-dependent way.

In some arrangements, one or more of the drive radiation source 330, the interaction region 333, the optical system 312 and the substrate support 316 may be configured such that a first wavelength of the emitted radiation beam 342 forms a spot-size at a first depth of the substrate W and a further wavelength forms a further spot-size at a second depth of the substrate W. The first depth may be a surface of the substrate W. The first wavelength may be selected based on a sensitivity thereof to aspects of the feature T at the first depth. The further wavelength may be selected based on a sensitivity thereof to aspects of the feature at the second depth. Specifically, the first wavelength may be selected to have a sensitivity to the aspects at the first depth that is above a threshold, and the further wavelength may be selected to have a sensitivity to the aspects at the second depth that is above a further threshold.

In some arrangements, the feature T may be a metrology target. One or more of the drive radiation source 330, the interaction region 333, the optical system 312 and the substrate support 316 may be configured to control an axial position of the substrate W relative to the plurality of focal planes 500 such that a first wavelength of the emitted radiation beam 342 forms a spot-size at the substrate underfilling the target, and a second wavelength of the emitted radiation beam 342 forms a spot-size overfilling the target. The first wavelength may be selected because it has a sensitivity above a threshold to target features. The second wavelength may be selected because it has a sensitivity below a threshold to features of the substrate W outside the target area.

A computer program may be configured to provide any part of the above described methods. The computer program may be provided on a computer readable medium. The computer program may be a computer program product. The product may comprise a non-transitory computer usable storage medium. The computer program product may have computer-readable program code embodied in the medium configured to perform the method. The computer program product may be configured to cause at least one processor to perform some or all of the method.

Various methods and apparatus are described herein with reference to, apparatus (systems and/or devices) and/or computer program products. Computer program instructions may be provided to a processor circuit of a general purpose computer circuit, special purpose computer circuit, and/or other programmable data processing circuit to produce a machine, such that the instructions, which execute via the processor of the computer and/or other programmable data processing apparatus, transform and control transistors, values stored in memory locations, and other hardware components within such circuitry to implement the functions/acts specified herein and thereby create means (functionality) and/or structure for implementing the functions/acts specified.

Computer program instructions may also be stored in a computer-readable medium that can direct a computer or other programmable data processing apparatus to function in a particular manner, such that the instructions stored in the computer-readable medium produce an article of manufacture including instructions which implement the functions/acts specified.

A tangible, non-transitory computer-readable medium may include an electronic, magnetic, optical, electromagnetic, or semiconductor data storage system, apparatus, or device. More specific examples of the computer-readable medium would include the following: a portable computer diskette, a random access memory (RAM) circuit, a read-only memory (ROM) circuit, an erasable programmable read-only memory (EPROM or Flash memory) circuit, a portable compact disc read-only memory (CD-ROM), and a portable digital video disc read-only memory (DVD/Blu-ray).

The computer program instructions may also be loaded onto a computer and/or other programmable data processing apparatus to cause a series of operational steps to be performed on the computer and/or other programmable apparatus to produce a computer-implemented process such that the instructions which execute on the computer or other programmable apparatus provide steps for implementing the functions/acts specified.

Accordingly, the invention may be embodied in hardware and/or in software (including firmware, resident software, micro-code, etc.) that runs on a processor, which may collectively be referred to as "circuitry," "a module" or variants thereof.

Further embodiments are disclosed in the subsequent numbered clauses:

1. An apparatus for directing onto a substrate a radiation beam emitted as a result of high harmonic generation (HHG), the apparatus comprising:
  a drive radiation source;
  an interaction region configured to receive a medium and positioned such that a drive radiation beam from the drive radiation source interacts with the medium during use to generate the emitted radiation beam by HHG, wherein the emitted radiation beam comprises a plurality of wavelengths and wherein an emission divergence angle of the emitted radiation is wavelength dependent;
  an optical system downstream of the interaction region and configured to focus the emitted radiation beam, wherein the plurality of wavelengths of the emitted radiation beam are focused at a plurality of focal planes in dependence on the associated emission divergence angle; and
  a substrate support for holding the substrate at one of a plurality of axial positions relative to the plurality of focal planes,
  wherein one or more of the drive radiation source, the interaction region, the optical system and the substrate support is configurable to control a relative position of at least one of the focal planes with respect to the substrate.

2. The apparatus according to claim 1, wherein the interaction region comprises a nozzle for directing the medium toward the interaction region or a gas cell for retaining the medium, and wherein the nozzle or gas cell is configured for control of an axial position of the medium.

3. The apparatus according to claim 1 or 2, wherein the drive radiation source is configured for control of an axial position of a focal point of the drive radiation beam.

4. The apparatus according to any preceding claim, wherein the optical system is configured to control an axial position of one or more of the focal planes.

5. The apparatus according to any preceding claim, wherein the substrate support is configured to control an axial position of the substrate held thereon.

6. The apparatus according to any preceding claim, wherein when the emitted radiation beam is diffracted and/or reflected from a feature on the substrate, an intensity of diffracted and/or reflected radiation is dependent on wavelength of the emitted radiation beam,
  and wherein the one or more of the drive radiation source, the interaction region, the optical system and the substrate support is configurable to control the relative position of at least one of the focal planes with respect to the substrate based on the intensity of the diffracted and/or reflected radiation.

7. The apparatus according to claim 6, wherein the diffracted and/or reflected radiation comprises positive and negative orders and a difference in intensity between the positive and negative orders is dependent on wavelength of the emitted radiation beam,
  and wherein the one or more of the drive radiation source, the interaction region, the optical system and the substrate support is configurable to control the relative position of at least one of the focal planes with respect to the substrate based on the difference in intensity between positive and negative orders.

8. The apparatus according to claim 7, wherein a first difference in intensity is based on the feature having no error in one or more parameters, and wherein a second difference in intensity is based on the feature having a particular error in the one or more parameters,
  and wherein the one or more of the drive radiation source, the interaction region, the optical system and the substrate support is configurable to control the relative position of at least one of the focal planes with respect to the substrate based on a difference between the first difference in intensity and the second difference in intensity.

9. The apparatus according to any of claims 6 to 8, wherein the one or more of the drive radiation source, the interaction region, the optical system and the substrate support is configurable to position a selected focal plane to be substantially coincident with a plane of the substrate, wherein the selected focal plane is determined based on the intensity of diffracted and/or reflected radiation.

10. The apparatus according to claim 9, wherein the one or more of the drive radiation source, the interaction region, the optical system and the substrate support is configurable to position a plurality of selected focal planes to be substantially coincident with the substrate.

11. The apparatus according to any of claims 6 to 10, further comprising a first radiation detector configured to detect the positive order of diffracted and/or reflected radiation and a second radiation detector configured to detect the negative order of diffracted and/or reflected radiation.

12. The apparatus according to any preceding claim, wherein the one or more of the drive radiation source, the interaction region, the optical system and the substrate support is configured such that a first wavelength of the emitted radiation beam forms a first spot-size at the substrate and a second wavelength of the emitted radiation beam forms a second spot-size at the substrate that is larger than the first spot-size, the apparatus comprising at least one radiation detector configured to receive first diffracted and/or reflected radiation diffracted and/or reflected from a feature of the substrate at the first wavelength and second diffracted and/or reflected radiation diffracted and/or reflected from a feature of the substrate at the second wavelength; and a processor configured to execute computer program code to undertake the method of:

comparing an intensity of the first diffracted and/or reflected radiation to an intensity of the second diffracted and/or reflected radiation; and determining a model for intensity of diffracted and/or reflected radiation as a function of spot-size.

13. The apparatus according to claim 12, wherein the feature of the substrate comprises a plurality of lines fabricated on the substrate, and wherein the model is indicative of an effect of the lines on the diffracted and/or reflected radiation.

14. The apparatus according to any preceding claim, wherein the one or more of the drive radiation source, the interaction region, the optical system and the substrate support is configured such that at least one wavelength of the emitted radiation beam forms a first spot-size at the substrate and subsequently forms a second spot-size at the substrate that is different to the first spot-size, the apparatus comprising at least one radiation detector configured to receive first diffracted and/or reflected radiation diffracted and/or reflected from a feature of the substrate at the at least one wavelength having the first spot-size and second diffracted and/or reflected radiation diffracted and/or reflected from the feature of the substrate at the at least one wavelength having the second spot-size; and a processor configured to execute computer program code to undertake the method of:

determining an intensity of the emitted radiation at the first spot-size and an intensity of the emitted radiation at the second spot-size;

determining an intensity of the first diffracted and/or reflected radiation and an intensity of the second diffracted and/or reflected radiation; and based on the determined intensities, determining a model for intensity of diffracted and/or reflected radiation as a function of spot-size.

15. The apparatus according to claim 15, wherein the determined model is indicative of non-linear effects on intensity of diffracted and/or reflected radiation with spot-size.

16. The apparatus according to any of claims 12 to 14, wherein the processor is further configured to:

predict an intensity of one or more pixels of an image of radiation diffracted and/or reflected from the feature based on the determined model;

compare the predicted intensity with a measured intensity of one or more corresponding pixels of an image of radiation diffracted and/or reflected from the feature; and determine one or more parameters of a lithographic patterning process based on the comparison.

17. The apparatus according to any preceding claim, wherein the one or more of the drive radiation source, the interaction region, the optical system and the substrate support is configured such that at least one wavelength of the emitted radiation beam is focused on the substrate to form a spot-size at a diameter greater than a threshold value.

18. The apparatus according to any preceding claim, wherein the one or more of the drive radiation source, the interaction region, the optical system and the substrate support is configured such that a first wavelength of the emitted radiation beam forms a first spot-size at a first depth of the substrate and a second wavelength of the emitted radiation forms a second spot-size at a second depth of the substrate.

19. The apparatus according to claim 18, wherein the first wavelength is selected based on a sensitivity of the first wavelength to aspects of a feature of the substrate at the first depth and/or the second wavelength is selected based on a sensitivity of the second wavelength to aspects of a feature of the substrate at the second depth.

20. The apparatus according to any preceding claim, wherein a feature of the substrate comprises a target, and wherein the one or more of the drive radiation source, the interaction region, the optical system and the substrate support is configured such that a first wavelength of the emitted radiation forms a spot-size underfilling the target and a second wavelength of the emitted radiation forms a spot-size overfilling the target.

21. The apparatus according to claim 20, wherein the first and/or second wavelengths are selected based on their sensitivity to aspects of the target and/or aspects of further features of the substrate outside an area of the target.

22. The apparatus according to any preceding claim, wherein the emitted radiation has a wavelength in a range from 0.1 nm to 100 nm.

23. A metrology apparatus comprising the apparatus according to any preceding claim.

24. A method of directing radiation towards a feature of a substrate, the method comprising:

directing a drive radiation beam from a drive radiation source towards an interaction region, the interaction region including a medium configured to interact with the drive radiation to generate the emitted radiation by HIM, wherein the emitted radiation beam comprises a plurality of wavelengths and wherein an emission divergence angle of the emitted radiation is wavelength dependent;

propagating the emitted radiation through an optical system downstream of the interaction region;

focusing the emitted radiation beam onto a substrate held by a substrate support, wherein the plurality of wavelengths of the emitted radiation beam are focused at a plurality of focal planes in dependence on the associated emission divergence angle; and controlling one or more of the drive radiation source, the interaction region, the optical system and the substrate support is configurable to control a relative position of at least one of the focal planes with respect to the substrate.

25. The method according to claim 24, further comprising:
configuring the one or more of the drive radiation source, the interaction region, the optical system and the substrate support such that a first wavelength of the emitted radiation beam forms a first spot-size at the substrate and a second wavelength of the emitted radiation beam forms a second spot-size at the substrate that is larger than the first spot-size;
receiving, by at least one radiation detector, first diffracted and/or reflected radiation diffracted and/or reflected from a feature of the substrate at the first wavelength and second diffracted and/or reflected radiation diffracted and/or reflected from a feature of the substrate at the second wavelength;
comparing an intensity of the first diffracted and/or reflected radiation to an intensity of the second diffracted and/or reflected radiation; and
determining a model for intensity of diffracted and/or reflected radiation as a function of spot-size.

26. The method according to claim 24 or 25, further comprising:
configuring the one or more of the drive radiation source, the interaction region, the optical system and the substrate support such that at least one wavelength of the emitted radiation beam forms a first spot-size at the substrate and subsequently forms a second spot-size at the substrate that is different to the first spot-size,
receiving, by at least one radiation detector, first diffracted and/or reflected radiation diffracted and/or reflected from a feature of the substrate at the at least one wavelength having the first spot-size and second diffracted and/or reflected radiation diffracted and/or reflected from the feature of the substrate at the at least one wavelength having the second spot-size;
determining an intensity of the emitted radiation at the first spot-size and an intensity of the emitted radiation at the second spot-size;
determining an intensity of the first diffracted and/or reflected radiation and an intensity of the second diffracted and/or reflected radiation; and
based on the determined intensities, determining a model for intensity of diffracted and/or reflected radiation as a function of spot-size.

27. The method according to any of claims 24 to 26, further comprising configuring the one or more of the drive radiation source, the interaction region, the optical system and the substrate support is configured such that at least one wavelength of the emitted radiation beam is focused at the substrate to form a spot-size at a diameter greater than a threshold value.

28. The method according to any of claims 24 to 27, further comprising configuring the one or more of the drive radiation source, the interaction region, the optical system and the substrate support is configured such that a first wavelength of the emitted radiation beam forms a first spot-size at a first depth of the substrate and a second wavelength of the emitted radiation forms a second spot-size at a second depth of the substrate.

29. A computer program comprising instructions which, when executed on at least one processor, cause the at least one processor to control an apparatus to carry out the method according to any of claims 24 to 28.

30. A carrier containing the computer program of claim 29, wherein the carrier is one of an electronic signal, optical signal, radio signal, or non-transitory computer readable storage medium.

It should also be noted that in some alternate implementations, the functions/acts noted may occur out of the order noted. Moreover, the functionality of a step may be separated into multiple steps and/or the functionality of two or more steps may be at least partially integrated. Finally, other steps may be added/inserted between the blocks that are illustrated.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. An apparatus for directing onto a substrate a radiation beam emitted as a result of high harmonic generation (HHG), the apparatus comprising:
a drive radiation source;
an interaction region configured to receive a medium and positioned such that a drive radiation beam from the drive radiation source interacts with the medium during use to generate the emitted radiation beam by HHG, wherein the emitted radiation beam comprises a plurality of wavelengths and wherein an emission divergence angle of the emitted radiation is wavelength dependent;
an optical system downstream of the interaction region and configured to focus the emitted radiation beam, wherein the plurality of wavelengths of the emitted radiation beam are focused at a plurality of focal planes in dependence on the associated emission divergence angle; and
a substrate support for holding the substrate at one of a plurality of axial positions relative to the plurality of focal planes,
wherein one or more of the drive radiation source, the interaction region, the optical system and the substrate support is configurable to control a relative position of the plurality of focal planes with respect to the substrate such that the emitted radiation beam illuminates the substrate at the plurality of focal planes.

2. The apparatus of claim 1, wherein at least one of:
the interaction region comprises a nozzle for directing the medium toward the interaction region or a gas cell for retaining the medium, and wherein the nozzle or gas cell is configured for control of an axial position of the medium,
the drive radiation source is configured for control of an axial position of a focal point of the drive radiation beam,
the optical system is configured to control an axial position of one or more of the focal planes, and
the substrate support is configured to control an axial position of the substrate held thereon.

3. The apparatus of claim 1, wherein when the emitted radiation beam is diffracted and/or reflected from a feature on the substrate, an intensity of diffracted and/or reflected radiation is dependent on a wavelength of the emitted radiation beam, and
wherein the one or more of the drive radiation source, the interaction region, the optical system and the substrate support is configurable to control the relative position of at least one of the focal planes with respect to the substrate based on the intensity of the diffracted and/or reflected radiation.

4. The apparatus of claim 3, wherein the diffracted and/or reflected radiation comprises positive and negative orders and a difference in intensity between the positive and negative orders is dependent on a wavelength of the emitted radiation beam,
and wherein the one or more of the drive radiation source, the interaction region, the optical system and the substrate support is configurable to control the relative position of at least one of the focal planes with respect to the substrate based on the difference in intensity between positive and negative orders.

5. The apparatus of claim 4, wherein the first difference in intensity is based on the feature having no error in one or more parameters, and wherein a second difference in intensity is based on the feature having a particular error in the one or more parameters,
and wherein the one or more of the drive radiation source, the interaction region, the optical system and the substrate support is configurable to control the relative position of at least one of the focal planes with respect to the substrate based on a difference between the first difference in intensity and the second difference in intensity.

6. The apparatus of claim 3, wherein the one or more of the drive radiation source, the interaction region, the optical system and the substrate support is configurable to position a selected focal plane to be substantially coincident with a plane of the substrate, wherein the selected focal plane is determined based on the intensity of diffracted and/or reflected radiation.

7. The apparatus of claim 3, further comprising a first radiation detector configured to detect the positive order of diffracted and/or reflected radiation and a second radiation detector configured to detect the negative order of diffracted and/or reflected radiation.

8. The apparatus of claim 3, wherein the one or more of the drive radiation source, the interaction region, the optical system and the substrate support is configurable to position a plurality of selected focal planes to be substantially coincident with the substrate.

9. The apparatus of claim 1, wherein the one or more of the drive radiation source, the interaction region, the optical system and the substrate support is configured such that a first wavelength of the emitted radiation beam forms a first spot-size at the substrate and a second wavelength of the emitted radiation beam forms a second spot-size at the substrate that is larger than the first spot-size,
the apparatus comprising at least one radiation detector configured to receive first diffracted and/or reflected radiation diffracted and/or reflected from a feature of the substrate at the first wavelength and second diffracted and/or reflected radiation diffracted and/or reflected from a feature of the substrate at the second wavelength; and
a processor configured to execute computer program code to undertake the method of:
comparing an intensity of the first diffracted and/or reflected radiation to an intensity of the second diffracted and/or reflected radiation; and
determining a model for intensity of diffracted and/or reflected radiation as a function of spot-size,
and wherein, optionally, the feature of the substrate comprises a plurality of lines fabricated on the substrate, and wherein the model is indicative of an effect of the lines on the diffracted and/or reflected radiation.

10. The apparatus of claim 9, wherein the processor is further configured to execute computer program code to:
predict an intensity of one or more pixels of an image of radiation diffracted and/or reflected from the feature based on the determined model;
compare the predicted intensity with a measured intensity of one or more corresponding pixels of an image of radiation diffracted and/or reflected from the feature; and
determine one or more parameters of a lithographic patterning process based on the comparison.

11. The apparatus of claim 1, wherein the one or more of the drive radiation source, the interaction region, the optical system and the substrate support is configured such that at least one wavelength of the emitted radiation beam forms a first spot-size at the substrate and subsequently forms a second spot-size at the substrate that is different to the first spot-size,
the apparatus comprising at least one radiation detector configured to receive first diffracted and/or reflected radiation diffracted and/or reflected from a feature of the substrate at the at least one wavelength having the first spot-size and second diffracted and/or reflected radiation diffracted and/or reflected from the feature of the substrate at the at least one wavelength having the second spot-size; and
a processor configured to execute computer program code to:
determine an intensity of the emitted radiation at the first spot-size and an intensity of the emitted radiation at the second spot-size;
determine an intensity of the first diffracted and/or reflected radiation and an intensity of the second diffracted and/or reflected radiation; and
based on the determined intensities, determine a model for intensity of diffracted and/or reflected radiation as a function of spot-size,
and wherein the determined model is indicative of non-linear effects on intensity of diffracted and/or reflected radiation with spot-size.

12. The apparatus of claim 1, wherein at least one of:
the one or more of the drive radiation source, the interaction region, the optical system and the substrate support is configured such that at least one wavelength of the emitted radiation beam is focused on the substrate to form a spot-size at a diameter greater than a threshold value, the one or more of the drive radiation source, the interaction region, the optical system and the substrate support is configured such that a first wavelength of the emitted radiation beam forms a first spot-size at a first depth of the substrate and a second wavelength of the emitted radiation forms a second spot-size at a second depth of the substrate, and wherein the first wavelength is selected based on a sensitivity of the first wavelength to aspects of a feature of the substrate at the first depth and/or the second wavelength is selected based on a sensitivity of the second wavelength to aspects of a feature of the substrate at the second depth, a feature of the substrate comprises a target, and wherein the one or more of the drive radiation source, the interaction region, the optical system and the substrate support is configured such that a first wavelength of the emitted radiation forms a spot-size underfilling the target and a second wavelength of the emitted radiation forms a spot-size overfilling the target, and wherein the first and/or second wavelengths are selected based on their sensitivity to aspects of the target and/or aspects of further features of the substrate outside an area of the target.

13. The apparatus of claim 1, wherein the emitted radiation has a wavelength in a range from 0.1 nm to 100 nm.

14. A metrology apparatus, comprising an apparatus for directing onto a substrate a radiation beam emitted as a result of high harmonic generation (HHG), the apparatus comprising:
a drive radiation source;
an interaction region configured to receive a medium and positioned such that a drive radiation beam from the drive radiation source interacts with the medium during use to generate the emitted radiation beam by HHG, wherein the emitted radiation beam comprises a plurality of wavelengths and wherein an emission divergence angle of the emitted radiation is wavelength dependent;
an optical system downstream of the interaction region and configured to focus the emitted radiation beam, wherein the plurality of wavelengths of the emitted radiation beam are focused at a plurality of focal planes in dependence on the associated emission divergence angle; and
a substrate support for holding the substrate at one of a plurality of axial positions relative to the plurality of focal planes,
wherein one or more of the drive radiation source, the interaction region, the optical system and the substrate support is configurable to control a relative position of the plurality of focal planes with respect to the substrate such that the emitted radiation beam illuminates the substrate at the plurality of focal planes.

15. A method of directing radiation towards a feature of a substrate, the method comprising:
directing a drive radiation beam from a drive radiation source towards an interaction region, the interaction region including a medium configured to interact with the drive radiation to generate the emitted radiation by HHG, wherein the emitted radiation beam comprises a plurality of wavelengths and wherein an emission divergence angle of the emitted radiation is wavelength dependent;
propagating the emitted radiation through an optical system downstream of the interaction region;
focusing the emitted radiation beam onto a substrate supported by a substrate support, wherein the plurality of wavelengths of the emitted radiation beam are focused at a plurality of focal planes in dependence on the associated emission divergence angle; and
controlling one or more of the drive radiation source, the interaction region, the optical system and the substrate support to control a relative position of the plurality of focal planes with respect to the substrate such that the emitted radiation beam illuminates the substrate at the plurality of focal planes.

16. A computer program comprising instructions which, when executed on at least one processor, cause the at least one processor to control an apparatus to carry out the method of directing radiation towards a feature of a substrate, the method comprising:
directing a drive radiation beam from a drive radiation source towards an interaction region, the interaction region including a medium configured to interact with the drive radiation to generate the emitted radiation by HHG, wherein the emitted radiation beam comprises a plurality of wavelengths and wherein an emission divergence angle of the emitted radiation is wavelength dependent;
propagating the emitted radiation through an optical system downstream of the interaction region;
focusing the emitted radiation beam onto a substrate supported by a substrate support, wherein the plurality of wavelengths of the emitted radiation beam are focused at a plurality of focal planes in dependence on the associated emission divergence angle; and
controlling one or more of the drive radiation source, the interaction region, the optical system and the substrate support to control a relative position of the plurality of focal planes with respect to the substrate such that the emitted radiation beam illuminates the substrate at the plurality of focal planes.

* * * * *